United States Patent [19]

Whitlock

[11] 4,313,212
[45] Jan. 26, 1982

[54] ELECTRICAL CIRCUIT ARRANGEMENTS, FOR EXAMPLE FOR USE WITH COMMUNICATIONS RECEIVERS

[75] Inventor: Ward P. Whitlock, Gaithersburg, Md.

[73] Assignee: Racal Communications Inc., Rockville, Md.

[21] Appl. No.: 938,440

[22] Filed: Aug. 31, 1978

[51] Int. Cl.³ .................... H04B 1/26; H04B 17/00
[52] U.S. Cl. .................... 455/146; 324/78 Z; 324/79 R; 455/157; 455/226; 455/315
[58] Field of Search ............ 325/363, 364, 344, 398, 325/455, 332, 334, 335, 430–433, 134, 133; 324/78 Z, 79 R; 455/154, 157–159, 145–148, 314–316, 226

[56] References Cited
U.S. PATENT DOCUMENTS 2,738,462  3/1956  Troxel .................... 324/79 R
2,972,108  2/1961  Stone, Jr. ................ 324/79 R
3,736,510  5/1973  Wu ....................... 325/455

*Primary Examiner*—Marc E. Bookbinder

[57] ABSTRACT

A fully digitally-controlled system is disclosed which employs synthesized communications receivers to measure received signal frequency with greater resolution than that provided by the receiver alone. Variable frequency I.F. translation is used to provide this fine resolution. The operator has only one set of controls and one set of displays, with all other operations of the system being taken care of automatically without operator intervention. Proper performance of the associated one or two synthesized communications receivers is assured by continuous monitoring and display of the status of these receivers. In addition, the system may be remotely controlled; that is, it may report current frequency/bandwidth/mode settings to an external processor or it may receive commands from an external processor.

7 Claims, 6 Drawing Figures

Fig. I.

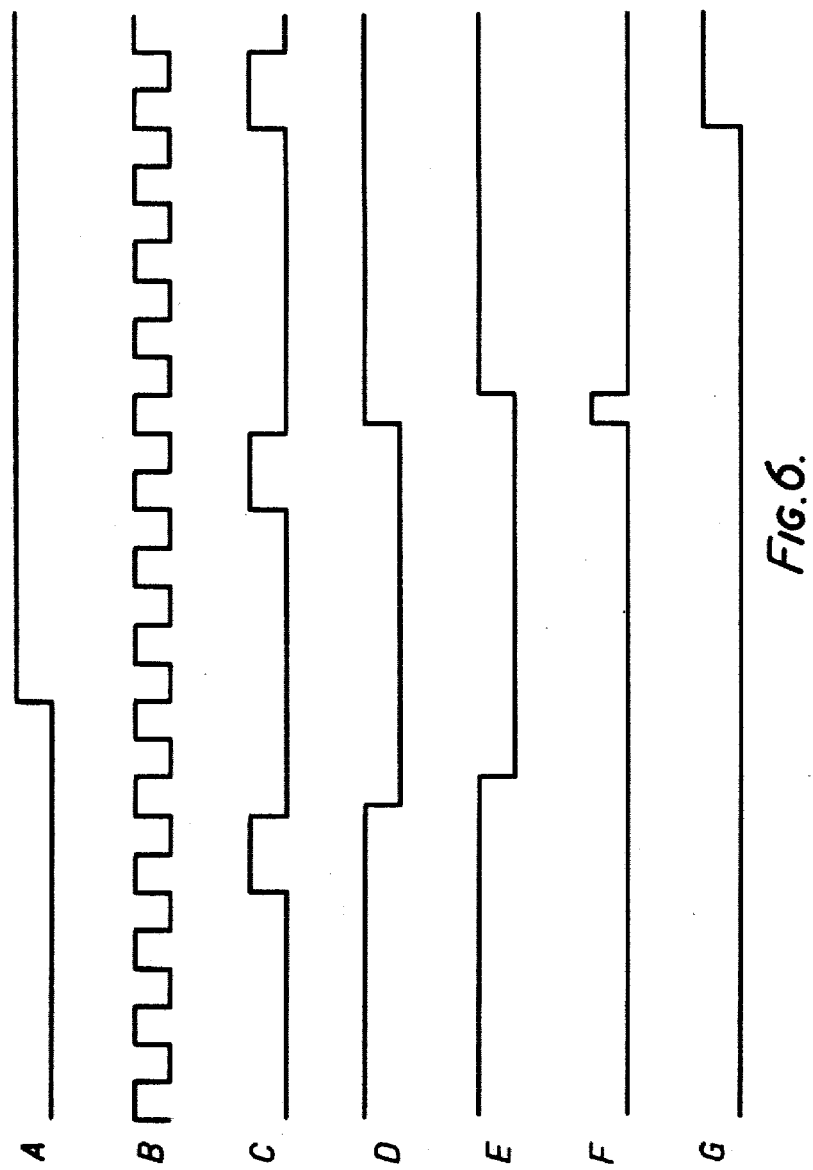

ELECTRICAL CIRCUIT ARRANGEMENTS, FOR EXAMPLE FOR USE WITH COMMUNICATIONS RECEIVERS

BACKGROUND OF THE INVENTION

The invention relates to electrical circuit arrangements and more particularly to such circuit arrangements for controlling other equipment, for example communications equipment.

The invention relates to electrical circuit arrangements for remote control of radio receiving equipment. Specifically, the communications receiver may be tuned to within 10 Hz of any given signal.

An object of the invention is to allow measurement of the frequency of any signal with greater resolution than that provided by the communications receiver itself. In the example disclosed, the communications receiver tunes in 10-Hz steps, while the operator has control of the frequency in approximately 1/10th-Hz steps, with a display of frequency to the nearest one Hz.

BRIEF SUMMARY OF THE INVENTION

According to the invention, there is provided an electrical circuit arrangement for controlling the tuning of a communications receiver and for tuning its I.F. output to a frequency offset by a predetermined increment from one of a plurality of standard tuning settings of the receiver, comprising frequency comparing means having first and second input means for respectively receiving two frequencies to be compared for equality, means feeding a reference frequency to the first input means of the frequency comparing means, frequency processing means having first and second input means, means feeding the intermediate frequency of the communications receiver to the first input means of the frequency processing means, variable oscillator means having a controllable output frequency, means feeding the output frequency of the oscillator means to the second input means of the frequency processing means, control means connected to control the output frequency of the oscillator means at such a value that the output from the frequency processing means has a frequency which is equal to the said reference frequency when the value of the intermediate frequency is offset from its nominal value by an amount equal to the said increment, and means connected to the frequency processing means to feed the said output thereof to the second input means of the frequency comparing means.

DESCRIPTION OF THE DRAWINGS

An electronic control circuit arrangement embodying the invention and for controlling the tuning of radio receiving apparatus will now be described, by way of example only, with reference to the accompanying drawings in which:

FIGS. 5a–e, and 6a–g show waveforms occurring in, and for controlling, the optical encoding unit of FIG. 4, for explaining its operation.

In the description to follow, the reference number given to a particular item is the same in each Figure of the drawings in which that item appears.

DESCRIPTION OF PREFERRED EMBODIMENTS

Figure 1:
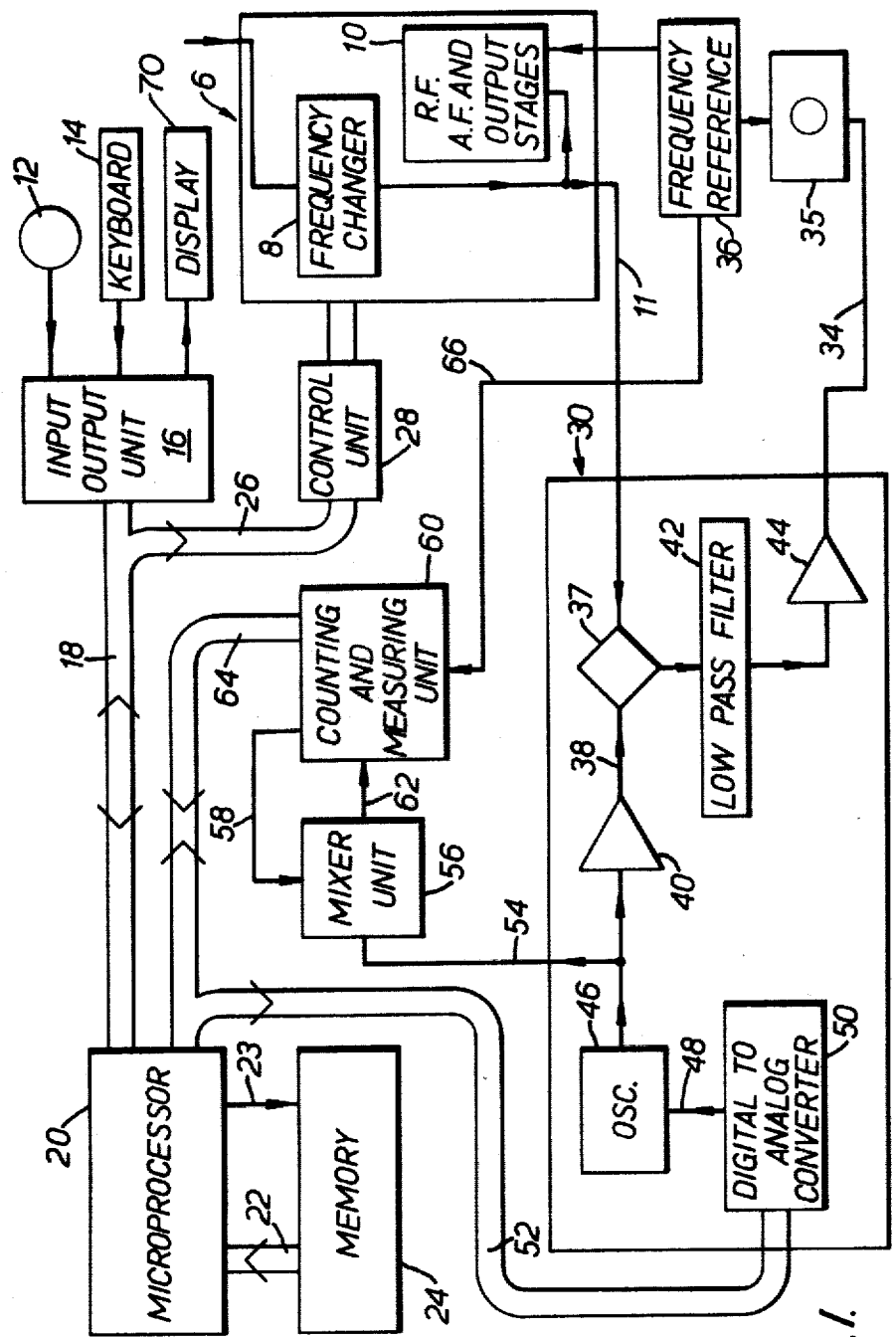
FIG. 1 is a block circuit diagram of the circuit arrangement.

The circuit arrangement to be described, and shown in general form in FIG. 1, is intended for controlling a radio receiver shown in general form by the block 6. The radio receiver does not form part of the present disclosure and may be of any suitable form. For example, it may be a wideband radio receiver Type RA6775-9, 10, manufactured by Racal Communications Inc., of Rockville, Md., having a range of 500 kHz to 30 MHz, tunable in 10 Hz steps. The circuit arrangement to be described tunes the receiver and enables its I.F. output, translated to 100 kHz, to be tuned in even smaller frequency increments. As shown, the receiver 6 has a frequency changer stage 8 and R.F., A.F. and output stages shown diagrammatically by a single block 10. The intermediate frequency (IF) signal from the frequency changer stage 8 is fed out on a line 11, as well as to the R.F., A.F. and output stages 10.

The ciruit arrangement has two manually operable controls by means of which an operator can cause it to tune the receiver 6 and the final I.F. converter 30. These controls consist of, in this example of the circuit diagram, an optical encoding arrangement 12 and a pushbutton keyboard 14. The optical encoding unit 12 whose circuitry and operation will be explained in more detail below, basically comprises a disc which is manually rotatable by the operator (by means of a front panel knob for example) and carries optically sensible marks which are moved by the disc past two photosensitive devices which are so arranged (in a manner to be described) that the encoder unit 12 produces two outputs, both of which are trains of pulses at a rate dependent on the angular rotation of the knob, and with a physical phase displacement of 90° which allows the system to determine direction of rotation.

The keyboard 14 consists of a number of keys (again mounted on the front panel) by means of which the operator can manually and digitally set up a desired frequency for the receiver and a final I.F. converter 30 to be described below.

The data input from the optical encoder unit 12 and the keyboard 14 is fed via an input/output unit 16 and a bi-directional data bus 18 to a microprocessor 20.

The microprocessor 20 may take any suitable form. For example, it may be a Type 18 microprocessor manufactured by Fairchild Camera and Instrument Company, Inc.

The microprocessor is connected by a data bus 22 and control lines shown collectively as 23 to a memory unit 24 comprising both read-only memory (ROM) and random access memory (RAM).

Output information from the microprocessor 20 for controlling the receiver 6 and the I.F. converter 30 (in dependence on settings of the optical encoder 12 and/or the keyboard 14) is fed to the receiver 6 via a data bus 26 and a control unit 28.

For measuring frequencies of received signals not in even 10 hz steps which the receiver 6 tunes, the circuit arrangement includes a converter unit 30 which receives, from the radio receiver 6 on the line 11, the receiver's intermediate frequency (IF) of, in this example, nominally 455 kHz, and outputs (in a manner to be described), on a line 34 a final IF of, in this example, nominally 100 kHz. The final IF feeds one set of plates of an oscilloscope 35 whose other set receives a stable 100 kHz input from a reference source 36.

As shown, the converter 30 comprises a mixer 37 which receives the 455 kHz IF on line 11 and also receives an adjustable frequency of nominally 355 kHz on a line 38 via an amplifier 40. A low pass filter 42 selects the lower sideband output (of nominally 100 kHz) from the mixer 37 and this is passed, via an amplifier 44, to the line 34.

The nominal 355 kHz signal for the input 38 of the mixer 37 is produced by a voltage controlled crystal oscillator 46. The actual frequency of the oscillator 46 is controlled by a voltage signal on a line 48 and this is in turn produced by the output of a digital to analog converter 50 which receives a digital input signal on a data bus 52 from the microprocessor 20.

For measuring the output frequency of the oscillator 46 (in a manner to be described), a line 54 feeds the oscillator output to one input of a mixer unit 56. The mixer unit 56 also receives a 50 kHz input on a line 58 from a counting and measuring unit 60. Within the mixer unit 56, in a manner to be described, the 50 kHz input line 58 is converted to 350 kHz and mixed with the nominal 355 kHz input on line 54. The resultant lower sideband output at (nominally) 5 kHz is fed by means of a line 62 to the counting and measuring unit 60 where a measurement is made, in a manner to be described, of its frequency to the nearest ¼ Hz (so as to determine thereby the frequency of the voltage controlled crystal oscillator 46 in the converter 30) and this information is fed back to the microprocessor 20 by means of a bi-directional data bus 64.

For controlling the counting and measuring unit 60, and for producing the 50 kHz signal on line 58, the reference source produces a stable output frequency of 5 MHz on a line 66.

As so far described, therefore, the overall operation of the circuit arrangement is as follows When the operator wishes to set up a desired initial frequency for the system, he enters the frequency by means of the keyboard 14, and digital data encoding this frequency passes to the microprocessor by means of the data bus 18. The microprocessor responds to this data in known manner by reading out pre-stored information from the RAM in the memory unit 24, being the necessary digital data to set up the local oscillator in the receiver 6 to the required frequency; and this digital data is fed to the receiver 6 by means of the data buses 18 and 26 and the control unit 28 which comprise the necessary commands to preset the receiver 6 to its appropriate conversion frequency. The converter 30 is preset to a known frequency by means of a frequency locked loop which employs the mixer/counting and measuring units 56 and 60 to produce frequency information which the microprocessor in turn uses to set the D to A converter 50 in the I.F. converter unit to set the converter oscillator 46 to the correct frequency to cause the final I.F. to be within ±0.5 Hz of the external frequency. At the same time, the controlled frequency of the system is displayed by means of an optical display unit 70 to which control data is fed by means of bus 18 from the microprocessor 20.

Assuming that the frequency selected by the operator on the keyboard is one of the standard frequency steps of the radio receiver 6, the IF of the radio receiver, as fed to the converter 30 on the line 11, will be exactly 455 kHz. The microprocessor 20 will, under such circumstances, produce a digital signal on bus 52 so as to cause the digital to analog converter to set the controlled oscillator 46 to exactly 355 kHz. Therefore, the final IF produced on line 34 will be exactly 100 kHz.

Under these circumstances, both sets of plates of the oscilloscope 35 will be receiving signals at 100 kHz, and the result will be the production on the oscilloscope screen of a stable Lissajou figure which will indicate to the operator that the receiver is correctly tuned.

The manner in which the frequency of the controlled oscillator 46 is measured will be described below, but first the operation of the circuit arrangement in the event that the operator wishes to interpolate between the standard frequency steps of the receiver will be considered.

As stated above, the receiver 6 is tunable in 10 Hz steps. If, therefore, the operator wishes to tune the system to an intermediate step, that is, say 5 Hz from a standard frequency for the receiver, the IF on line 11 from the receiver will be offset by 5 Hz from its nominal value of 455 kHz to, say, 455.005 kHz. If the frequency of the controlled oscillator 46 remains exactly at 355 kHz, the final IF on line 34 will be at 100.005 kHz, and therefore the Lissajou figure on the oscilloscope 35 will not be stationary. In a manner to be described in detail, the operator, from the keyboard or the tuning knob, adds 5 Hz to the previously tuned frequency. This will cause the system to tune the oscillator 46 of the final I.F. converter 30 to a frequency of 355.005 kHz so that once again the final I.F. becomes 100.000 kHz. In this way a stationary Lissajou figure is produced on the oscilloscope when the system is tuned to the desired incremental frequency.

The operator can increment the receiver frequency by means of the optical encoder unit 12 as well as by the keyboard 14. When the control knob on the optical encoder unit 12 is turned through a certain angular amount, a proportional number of pulses is fed to the microprocessor 20 on the data bus 18, together with a second signal indicating the direction of rotation of the operator's knob, that is, whether frequency increase or frequency decrease is being called for.

In response to an input from the optical encoder unit 12 or the keyboard 14, the microprocessor 20 outputs a resultant digital control signal (derived from the RAM in the memory unit 24) on the data bus 52 which sets up the digital to analog converter 50. The resultant analog voltage signal on line 48 adjusts the tuning of the voltage controlled oscillator 46 in a sense such as to make any incremental change in the final IF frequency on line 34 which is necessary to produce a stationary Lissajou figure on the oscilloscope 35 in the manner explained above.

The change in the output frequency of oscillator 46 is also fed to the mixer unit 56 on line 54 and, in a manner to be described, produces a consequent change in the 5 kHz frequency on line 62. The counting and measuring unit 60 detects this change and feeds it back to the microprocessor 20 on bus 64. In this way, the microprocessor 20 is made aware of the actual amount by which its output on bus 52 has altered the frequency of the oscillator 46.

The operation of the mixer unit 56 and the counting and measuring unit 60 will now be described in greater detail, with particular reference to FIGS. 2 and 3.

Figure 3:
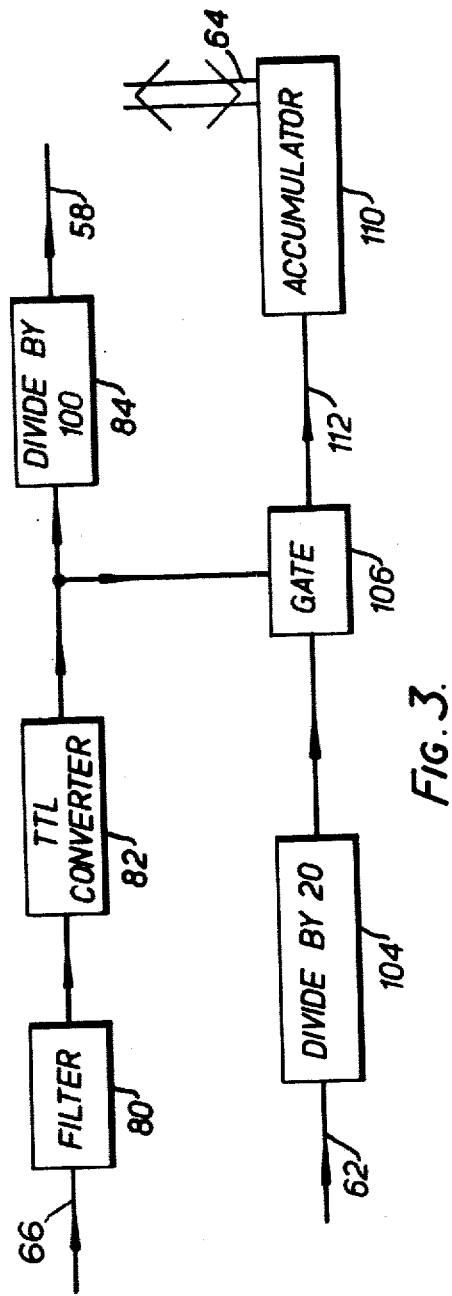
FIG. 3 is a block circuit diagram showing a counter block of the circuit diagram of FIG. 1 in greater detail.

Referring firstly to FIG. 3, the reference frequency of 5 MHz on line 66 is shown as being fed through a filter 80 and thence to a converter 82 which converts the 5 MHz signal to TTL form. The resultant output is fed through a divide-by-100 divider 84 to produce the required frequency of 50 kHz on line 58.

Figure 2:
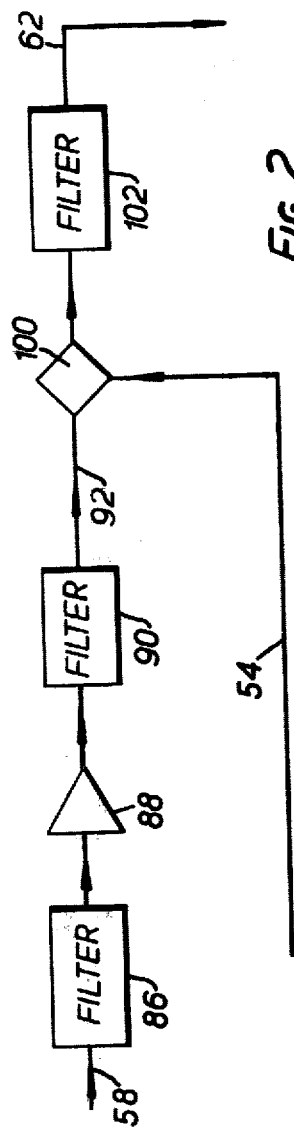
FIG. 2 is a block circuit diagram showing a mixer unit of the block diagram of FIG. 1 in greater detail.

Referring now to FIG. 2, the 50 kHz signal on line 58, which will now have a generally square-waveform and will therefore be rich in harmonics, is fed through a narrow band filter 86 which selects the harmonic at 350 kHz. This is then amplified in an amplifier 88 and passed through a further filter, similar to the filter 86, so as to produce a stable frequency of 350 kHz on a line 92 which is fed into one input of a mixer 100.

As explaind in connection with FIG. 1, the second input to the mixer 100 is the line 54 carrying the (nominal) 355 kHz output of the oscillator 46 (FIG. 1). A low pass filter 102, connected to the output of the mixer 100, selects the lower sideband output which will be nominally 5 kHz (varying therefrom by the amount by which the frequency of the oscillator 46 varies from the nominal 355 kHz), and this is fed to the counting and measuring unit 60 on line 62.

Referring again to FIG. 3, the nominally 5 kHz signal on line 62, carrying information representing the actual frequency of the oscillator 46 in the converter 30 (FIG. 1), is fed into a controlled divide-by-20 divider 104, and the resultant output is arranged to control a gate 106 so as successively to open the gate for periods of (nominally) 4 mS. A second input to gate 106 receives the 5 MHz reference signal (in TTL form) on a line 108, and this frequency is therefore gated into an 8-bit accumulator 110 by means of a line 112.

At the end of each OPEN period of gate 106, therefore, accumulator 110 stores a number representing the eight least significant bits (LSB) of the period of the nominally 5 kHz signal on line 62, and this number is fed to the microprocessor 20 by means of the data bus 64. The microprocessor 20 therefore converts this number into frequency terms (as by comparing it with pre-stored information in the RAM of the memory 24).

The system makes two uses of this frequency information, depending on whether or not the system is in the fine tune mode.

When in fine tune mode, the optical encoder is used to increment or decrement the digital to analog converter 50. The offset frequency of the converter oscillator, as measured here, is added to or subtracted from the currently tuned frequency of the receiver 6. This result, to the accuracy of 1 Hz, is then displayed on the front panel. When the ±10 Hz tuning range of the converter has been exceeded, the converter oscillator 46 is reset to 355.000 kHz, and the receiver frequency is updated. From this new base, the fine tune process is continued.

When the system is any tune mode other than fine, the converter is operated in a frequency lock mode. The 1 Hz tuning information is used to generate the desired converter offset frequency. The frequency information gathered, as described above, is compared to this offset. The difference between these two numbers is used to adjust the setting of converter 50 to bring the converter oscillator 46 to the correct frequency for the final I.F. translation.

The circuit arrangement and operation of the optical encoder unit 12 will now be described in more detail with particular reference to FIGS. 4 and 5.

Figure 4:
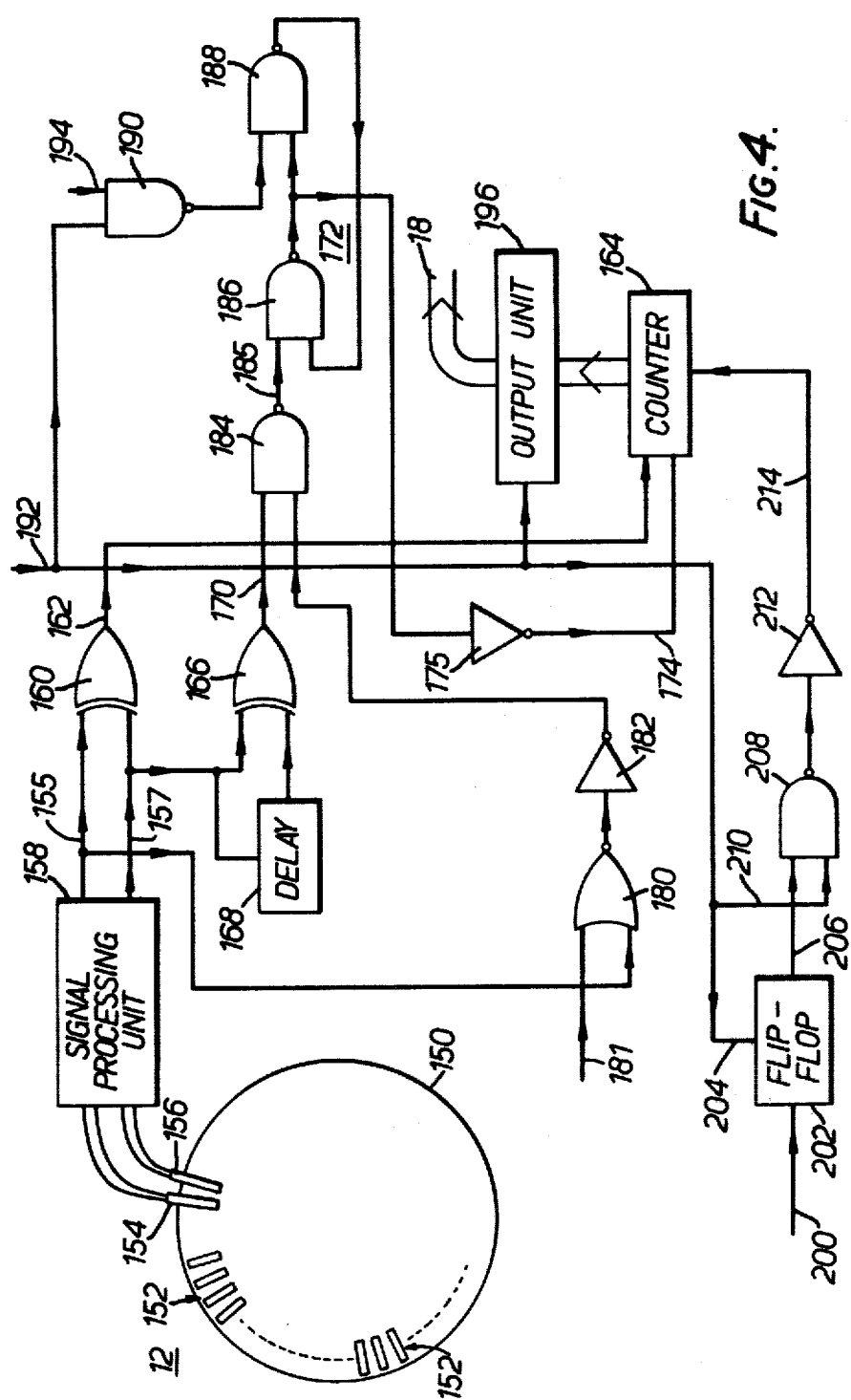
FIG. 4 is a block circuit diagram showing circuitry associated with an optical encoding unit used in the circuit arrangement of FIG. 1.
Figure 5:
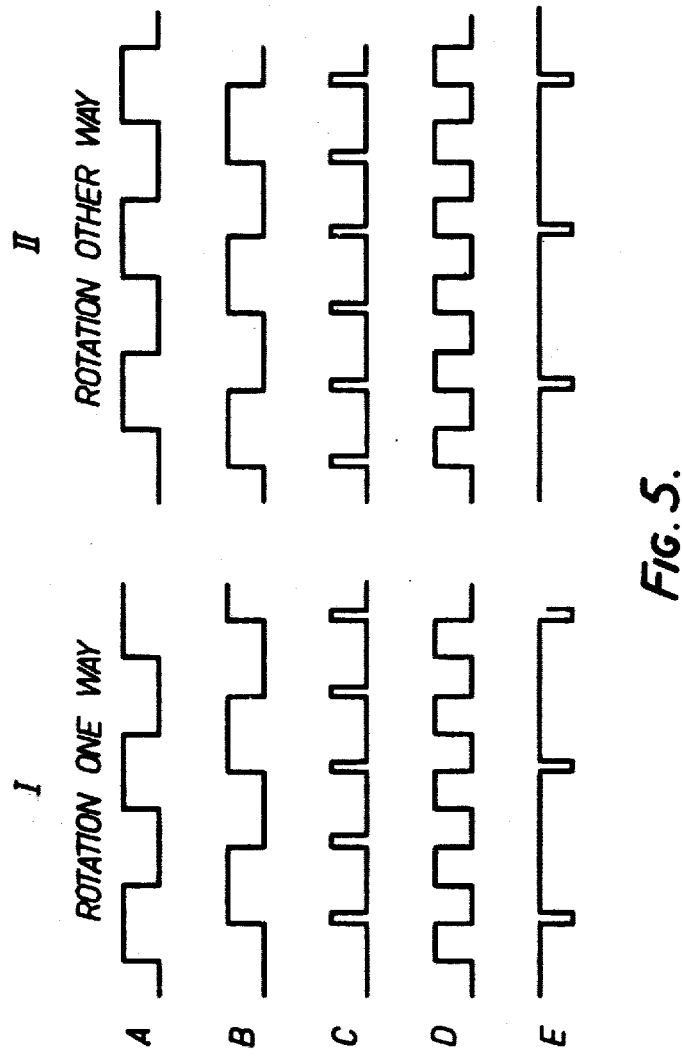

As shown diagrammatically in FIG. 4, the optical encoder unit 12 includes a disc 150 which is mounted to be rotatable by means of a manually operable knob and which carries optically sensible marks 152 arranged equi-angularly around its circumference and shown purely diagrammatically in the Figure. The marks 152 therefore produce light and dark areas which alternate around the periphery of the disc 150.

Two photodetectors 154 and 156 are positioned adjacent the periphery of the disc 150 so as to produce an electrical output waveform which varies as the light and dark areas on the disc pass them. In FIG. 5, I denotes the waveforms produced when the disc rotates in one direction and II the waveforms when it rotates in the opposite direction. The signals produced by the photodetectors are sine wave signals—since the line and aperture are of approximately the same size. The signals are fed to a signal processing unit 158 which is a fixed threshold Schmidt trigger which converts the sine waves to the square waves as shown in FIG. 5; waveforms 5A show the output waveform produced by the signal photodetector 154 after being processed by the signal processing unit 158. The photodetector 156 is spaced from the photodetector 154 (in a circumferential direction with respect to the disc 150) by a distance equal to half the width of one of the dark areas of the waveform 5A, and therefore produces the waveforms 5B after processing by unit 158.

As shown in FIG. 4, after amplifying and shaping in unit 158 the output from photodetector 154 on line 155 and the output of photodetector 156 on line 157 are fed to respective units of an EXCLUSIVE OR gate 160 which therefore produces an output on line 162 having the waveforms 5D. Line 162 is connected to a control input of a counter 164 and the digital level of the signal on line 162 determines whether the counter counts up or down.

In addition, output OI is fed directly to one input of a gate 166, similar to gate 160, and is fed, via a delay unit 168, to the second input of this gate. Therefore, waveforms 5C show the output pulses produced by gate 166.

These output pulses from gate 166 (that is, pulses having one of the waveforms 5C according to the direction of rotation of the disc 150) are fed on a line 170, and via logic 172, to a line 174 connected to the clock input of the counter 164 by means of an inverter 175.

The purpose of the logic 172 will be explained in detail below. Basically, however, it ensures that each pulse fed into the counter on line 174 does not exist for the full length of time of the corresponding pulse on line 170 (whose waveform is shown in 5C) plus a small amount of time to allow the pulse on line 170 to be synchronised with the operating sequence of the microprocessor. The counter 164 counts on the trailing edge of the pulse on line 174.

It will be apparent, however, by comparing each of waveforms 5C with the waveforms 5D (each of which is the waveform of the pulses fed into the control input of the counter 164 on line 162), that, when the disc is rotating in the first direction, the trailing edge of each pulse on line 174 occurs while the signal on line 162 (waveform 5D) is low and will be counted DOWN by counter 164, while, when the disc is rotating in the other direction, the trailing edge of each pulse on line 174 occurs while waveform 5D is high and therefore counter 164 will be counted UP.

It will be observed that the pulses of waveforms 5C occur at twice the frequency of the outputs of the photodetectors (as shown by waveforms 5A and 5B). By means of an OR gate 180, each alternate pulse of waveforms 5C can be deleted, and in this way the size of the frequency increment produced by a given angular movement of the disc 150 can be halved.

As shown in FIG. 4, gate 180 has one input connected to receive the output OI of the photodetector 156 (that is, waveform 5A). The second input of the gate 180 is a FAST/SLOW signal controlled by the operator on line 181. This signal is set high when a FAST tuning rate is desired, and is set low when a SLOW tuning rate is desired.

The output of gate 180 is fed through an inverter 182 as one input to a NAND gate 184, the second of which receives the pulses on line 170. Waveforms 5E show the output of the inverter on line 182 on line 185 when the system is set for SLOW tuning (the output will have twice the frequency when set to FAST tuning).

The output of gate 184 is fed as one input to an R-S latch composed of gates 186 and 188. The second input to gate 188 receives an input from a NAND gate 190. The latter has two input lines 192 and 194 which respectively carry READ ENCODER and WRITE signals from the microprocessor. The purpose of these control signals will be described in more detail below. However, note that the output of the latch is taken from the output of gate 186, so that the information from gate 184 overrides the information from gate 190. Consequently whenever the encoder clock signal from gate 184 goes low, the input to the counter from inverter 175 on line 174 also goes low. When the encoder clock signal from gate 184 goes high, line 174 will remain low until the next output from gate 190. Thus the rising edge of the count input is determined by gate 190 and consequently the counter is synchronized with the microprocessor. The counted pulses from the counter 164 are fed to the microprocessor (on bus 18) via an output unit 196, again under control of the READ ENCODER signal on line 192. Thus the rising edge of the count input is determined by gate 190 and consequently the counter is synchronized with the microprocessor.

The pulses produced by the disc 150 will occur randomly. The synchronization of the resultant pulse count with the microprocessor by the READ ENCODER and WRITE signals on lines 192 and 194 has a signal φ on line 200 as will now be explained in more detail with reference to FIG. 6.

The micro-system reads the data and clears the counter 164 without losing a pending clock cycle. FIG. 6 shows the synchronization timing, waveform 6A being one of the signals on line 170 drawn to a larger scale than in FIG. 5, waveform 6B being control signals φ produced by the microprocessor on line 200, waveform 6C being the WRITE signals on line 194 and waveform 6D the READ ENCODER signal on line 192. When the READ ENCODER signal 192 goes low, tri-state buffer 196 is enabled, which places the five bits of encoder data from the counter 164 on the bus 18 from which it will be read by the microprocessor. The inverted φ signal on line 200 is used to produce a delayed version of the READ ENCODER signal on a line 206 (as shown inverted in waveform 6E) via a line 204 and a flip-flop 202. The signal on line 210 and the inverse of the delayed version are ANDED together in a gate 208 to produce a counter reset pulse 214 at the conclusion of the READ ENCODER cycle; this pulse is shown in waveform 6F.

Gate 190 is used to eliminate the reset pulse during the READ ENCODER cycle, this preventing the counter 164 from being incremented during a READ ENCODER cycle. Flip-flop 202 and associated gate 208 reset the counter 164 to zero after the microprocessor has read the contents of the counter. This reset occurs before the next output from gate 190, thus preserving clock pulses across encoder read accesses. The net result of all of this circuitry is to ensure that the clock pulses fed to the counter 164 on line 174 have their falling edges created by the encoder disc and their rising edges (see waveform 6G) timed to occur only during WRITE pulses, except when the encoder output is being read by the microprocessor.

SUMMARY OF THE DISCLOSURE

From the foregoing, it will be seen that there has been disclosed:

I. A basic microprocesor system consisting of CPU, interface and memory capable of controlling the operation of the control unit.
II. Operator interface, consisting of keyboards, encoders and displays operating under control of I. above.
III. Tunable I.F. converter which takes two independent channels of 455 kHz information and converts them to 100 kHz±10 Hz. This converter contains the converter module proper, the counter module and the mixer module. This tunable I.F. converter is digitally tunable in approximately 0.1-Hz steps. Its frequency is measured by the counter and mixer modules.
IV. Receiver interface capable of controlling and monitoring several radio receivers under command of I. above.
V. Optional remote control interface which may be customer-defined for either control or monitoring of the control unit. Interfaces the microprocessor of Item I. above to the customer's hardware.
VI. Firmware for the microprocessor to coordinate the hardware of Items I through V into a unified system with the following functions:
  1. Tune the associated receiver or receivers to within ±10 Hz of the desired frequency.
  2. Control and measure the frequency of the I.F. converter unit to provide I.F. interpolation between the stepped frequencies of the receiver in 1. above.
  3. Enable operator control of detection mode, bandwidth, and AGC/MGC operation of the associated receivers.
  4. Continuously check and monitor the associated receivers for proper data and fault status, displaying the fault status to the operator should one exist.
  5. Prepare data to be transmitted to any remote device, or format data received from a remote device for use in the controller.

The circuit arrangement described above is shown merely by way of example and is merely one of various different forms which the invention, as defined in the appended claims, can take, and various alterations, additions and modifications will be apparent to those skilled in the art; and accordingly such other forms, alterations and additions are to be construed as being included within the spirit and scope of the claims.

What is claimed is:

1. An electrical circuit arrangement for controlling the tuning of a communications receiver and for tuning it to a frequency offset by a predetermined increment from one of a plurality of standard tuning settings of the receiver, comprising adjustable tuning means in the receiver settable to tune it to any one of the standard tuning settings whereby in each case to produce an intermediate frequency having the same standard frequency, and settable to tune it to a frequency offset by the predetermined increment from one of the standard tuning settings whereby in each case to produce an intermediate frequency having a frequency offset from said standard frequency by the predetermined increment, frequency comparing means having first and second input means for respectively receiving two frequencies to be compared for equality, means feeding a reference frequency to the first input means of the frequency comparing means, frequency processing means having first and second input means, means feeding the intermediate frequency of the communications receiver to the first input means of the frequency processing means, variable oscillator means having a controllable output frequency, means feeding the output frequency of the oscillator means to the second input means of the frequency processing means, control means connected to control the output frequency of the oscillator means in dependence on the setting of the tuning means such that the output from the frequency processing means has a frequency which is equal to the said reference frequency when the value of the intermediate frequency is the standard frequency and when the value of the intermediate frequency is offset from the standard frequency by an amount equal to the said increment, and means connected to the frequency processing means to feed the said output thereof to the second input means of the frequency comparing means, so that the frequency comparing means produces an output indicating equality of the two frequencies compared.

2. An electrical circuit arrangement for controlling the tuning of a communications receiver and for tuning it to a frequency offset by a predetermined increment from one of a plurality of standard tuning settings of the receiver, comprising adjustable tuning means in the receiver settable to tune it to any one of the standard tuning settings whereby in each case to produce an intermediate frequency having the same standard frequency, and settable to tune it to a frequency offset by the predetermined increment from one of the standard tuning settings whereby in each case to produce an intermediate frequency having a frequency offset from said standard frequency by the predetermined increment, frequency comparing means having first and second input means for respectively receiving two frequencies to be compared for equality, means feeding a reference frequency to the first input means of the frequency comparing means, frequency mixing means having first and second input means for respectively receiving two frequencies to be mixed whereby to produce upper and lower sideband outputs, means feeding the intermediate frequency of the communications receiver to the first input means of the mixing means, variable oscillator means having a controllable output frequency, means feeding the output frequency of the oscillator means to the second input means of the mixing means, control means connected to control the output frequency of the oscillator means in dependence on the setting of the tuning means such that a predetermined one of the two sideband outputs from the mixing means has a frequency which is equal to the said reference frequency when the value of the intermediate frequency is the standard frequency and when the value of the intermediate frequency is offset from the standard frequency by an amount equal to the said increment, and means connected to the mixing means to feed the said predetermined one sideband output thereof to the second input means of the frequency comparing means, so that the frequency comparing means produces an output indicating equality of the two frequencies compared.

3. A circuit arrangement according to claim 2, in which the frequency comparing means comprises a cathode ray tube oscilloscope having X and Y sets of control plates, and in which the first and second input means of the frequency comparing means comprise, respectively, the inputs to the two sets of plates, whereby to produce a Lissajou figure on the oscilloscope.

4. A circuit arrangement according to claim 2, in which the control means comprises input means settable to a desired value for the tuning setting of the receiver, means connected to the input means and operative to derive a required value for the output frequency of the variable oscillator means and to produce a correspondingly valued control signal, means feeding the control signal to the variable oscillator means to determine its output frequency accordingly, and feedback means for measuring the actual value of the output frequency of the variable oscillator means, the feedback means comprising gating means connected to be opened for successive periods of time each dependent on the period of the output frequency of the variable oscillator means, a source of counting pulses having a predetermined frequency whose period is many times shorter than each period for which the gating means is open, counting means, means feeding the counting pulses to the counting means through the gating means whereby to produce a succession of counts in the counting means each dependent on the length of a respective one of the periods for which the gating means is held open, and means feeding the said counts back to the input means for deriving a corresponding frequency measurement for the output frequency of the oscillator means.

5. A circuit arrangement according to claim 4, in which the feedback means includes frequency changing means connected to receive the output frequency from the oscillator means and to change its value to a lower frequency for opening the gating means.

6. A circuit arrangement according to claim 4, in which the means for producing the control signal comprises digital operating means to produce the control signal as a digital signal, and including digital to analog converting means responsive to the digital control signal to convert it into an analog signal, and means feeding the analog signal to control the value of the output frequency of the oscillator means.

7. In combination, wideband radio receiver apparatus tunable to receive input signals at any one of a plurality of predetermined frequency values, and a frequency control circuit arrangement connected to the communications receiver for controlling it to receive input signals at frequencies intermediate the predetermined values; the communications receiver comprising frequency changing means connected to receive the input signals and settable to any one of a plurality of first predetermined settings each corresponding to a respective one of the predetermined frequency values whereby in each setting to produce an intermediate frequency signal having the same standard frequency, and settable to any one of a plurality of second settings in each of which the receiver is tuned to receive an input signal having a frequency intermediate two successive ones of the predetermined frequency values and produces a frequency for the intermediate frequency signal which is offset from said standard frequency by a predetermined increment; and the frequency control circuit arrangement comprising control means responsive to a desired value of input signal to which the communications receiver is to be tuned to produce a corresponding control signal, means feeding the control signal to the frequency changing means of the communications receiver to set it accordingly whereby to produce an intermediate frequency signal which has the standard frequency when the desired input frequency to which the receiver is to be tuned corresponds to one of the predetermined frequency values and which has a frequency offset from the standard frequency when the desired input frequency to which the receiver is to be tuned is offset from the predetermined frequency values, frequency comparing means having first and second input means for respectively receiving two frequencies to be compared for equality, a source of predetermined reference frequency connected to the first input means of the frequency comparing means, frequency mixing means having first and second input means for respectively receiving two frequencies to be mixed and producing upper and lower sideband outputs, means feeding the intermediate frequency signal from the communications receiver to the first input means of the mixing means, a variable frequency oscillator producing a variable frequency output, means feeding the variable frequency output of the oscillator to the second input means of the mixing means, means feeding a predetermined one of the upper and lower sideband outputs from the mixing means to the second input means of the frequency comparing means, and means connecting the control means to the variable frequency oscillator to control the value of the output frequency in dependence thereon so that the frequency comparing means detects equality between the two frequencies to be compared when the value of the intermediate frequency signal of the communications receiver is correct for the desired input frequency to which the receiver is to be tuned.

* * * * *